(12) United States Patent
Hu et al.

(10) Patent No.: US 12,346,034 B2
(45) Date of Patent: Jul. 1, 2025

(54) METHOD AND SYSTEM OF REMOVING PARTICLES FROM PELLICLE

(71) Applicant: TAIWAN SEMICONDUCTOR MANUFACTURING COMPANY, LTD., Hsinchu (TW)

(72) Inventors: Cheng-Kang Hu, Hsinchu (TW); Yin Yuan Chen, Hsinchu (TW); Ya-Chieh Wen, Hsinchu (TW); Hsu-Shui Liu, Hsinchu (TW); Jiun-Rong Pai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 6 days.

(21) Appl. No.: 18/138,012

(22) Filed: Apr. 21, 2023

(65) Prior Publication Data

US 2024/0353767 A1    Oct. 24, 2024

(51) Int. Cl.
*G03F 7/00* (2006.01)

(52) U.S. Cl.
CPC ...... *G03F 7/70925* (2013.01); *G03F 7/70983* (2013.01)

(58) Field of Classification Search
CPC .................. G03F 7/70925; G03F 7/70983
See application file for complete search history.

(56) References Cited

U.S. PATENT DOCUMENTS

| | | | |
|---|---|---|---|
| 10,651,058 B2 | 5/2020 | Nakai et al. | |
| 11,550,231 B2 | 1/2023 | Lombardo et al. | |
| 2008/0302390 A1 | 12/2008 | Rastegar | |
| 2010/0229902 A1* | 9/2010 | Kanzaki | H01L 22/12 134/56 R |
| 2018/0136573 A1* | 5/2018 | Dattilo | B24C 1/04 |
| 2021/0057209 A1* | 2/2021 | Wei | H01L 21/02052 |
| 2023/0021980 A1* | 1/2023 | Sun | G03F 1/82 |
| 2023/0205078 A1* | 6/2023 | Lee | G03F 1/82 134/6 |

FOREIGN PATENT DOCUMENTS

| | | | |
|---|---|---|---|
| CN | 113227904 A | 8/2021 | |
| TW | 201911407 A | 3/2019 | |
| WO | WO-2005003864 A2 * | 1/2005 | ......... G03F 7/70341 |
| WO | WO-2019115218 A1 * | 6/2019 | ............... G03F 1/62 |

OTHER PUBLICATIONS

JP H05196392A (Year: 1993).*
CN 109201364A (Year: 2019).*

* cited by examiner

*Primary Examiner* — Sharidan Carrillo
(74) *Attorney, Agent, or Firm* — STUDEBAKER BRACKETT PLLC

(57) ABSTRACT

A method of removing a particle from a pellicle includes moving a nozzle over a surface of a membrane of the pellicle to a location of the particle. A droplet of a liquid material is dispensed from the nozzle to cover the particle on the surface of the membrane. A contact of the droplet with the nozzle is monitored and maintained. The droplet carrying the particle is horizontally dragged along the surface of the membrane toward an edge thereof by the nozzle using the surface tension of the droplet. The droplet carrying the particle is sucked off from the edge of the membrane by a vacuum pump, thereby automatically and safely removing the particle without damaging the pellicle.

20 Claims, 13 Drawing Sheets

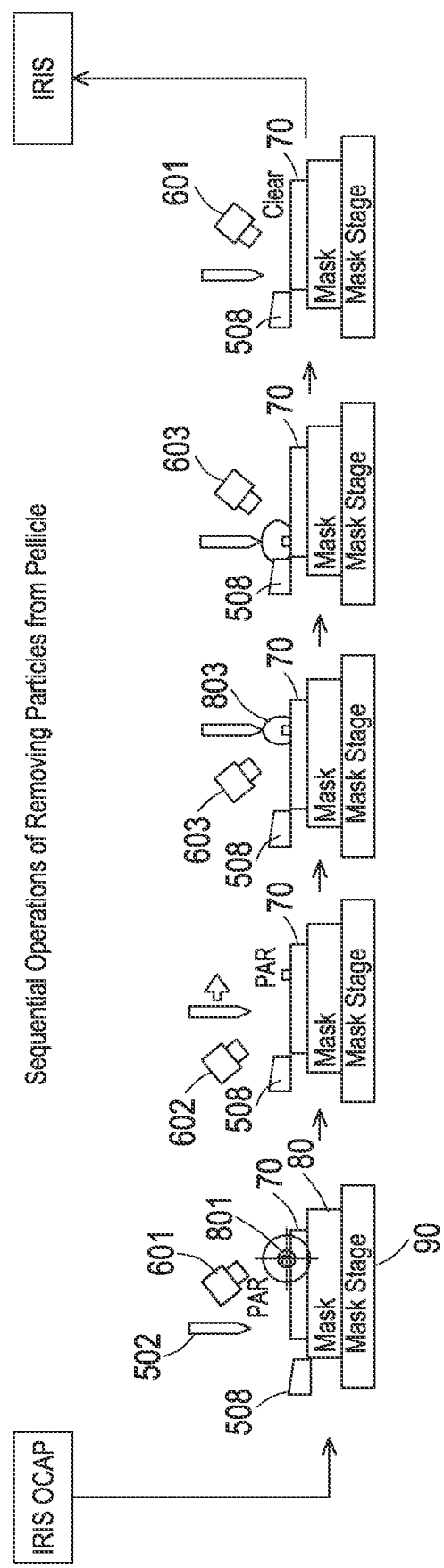

METHOD AND SYSTEM OF REMOVING PARTICLES FROM PELLICLE

BACKGROUND

During an integrated circuit (IC) design, a number of layout patterns of the IC, for different steps of IC processing, are generated on a substrate. The patterns may be produced by projecting, e.g., imaging, patterns of a mask on a photo resist layer of a wafer. A lithography process transfers the patterns of the mask to the photoresist layer of the substrate such that etching, implantation, or other steps are applied only to predefined regions of the substrate. Transferring the patterns of the mask to the photoresist layer may be performed e.g., using an extreme ultraviolet (EUV) radiation source to expose the photoresist layer of the substrate.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A, 7B, 7C, 7D and 7E show some sequential operations of removing a particle from a pellicle in accordance with some embodiments of the present disclosure.

DETAILED DESCRIPTION

Figure 1:
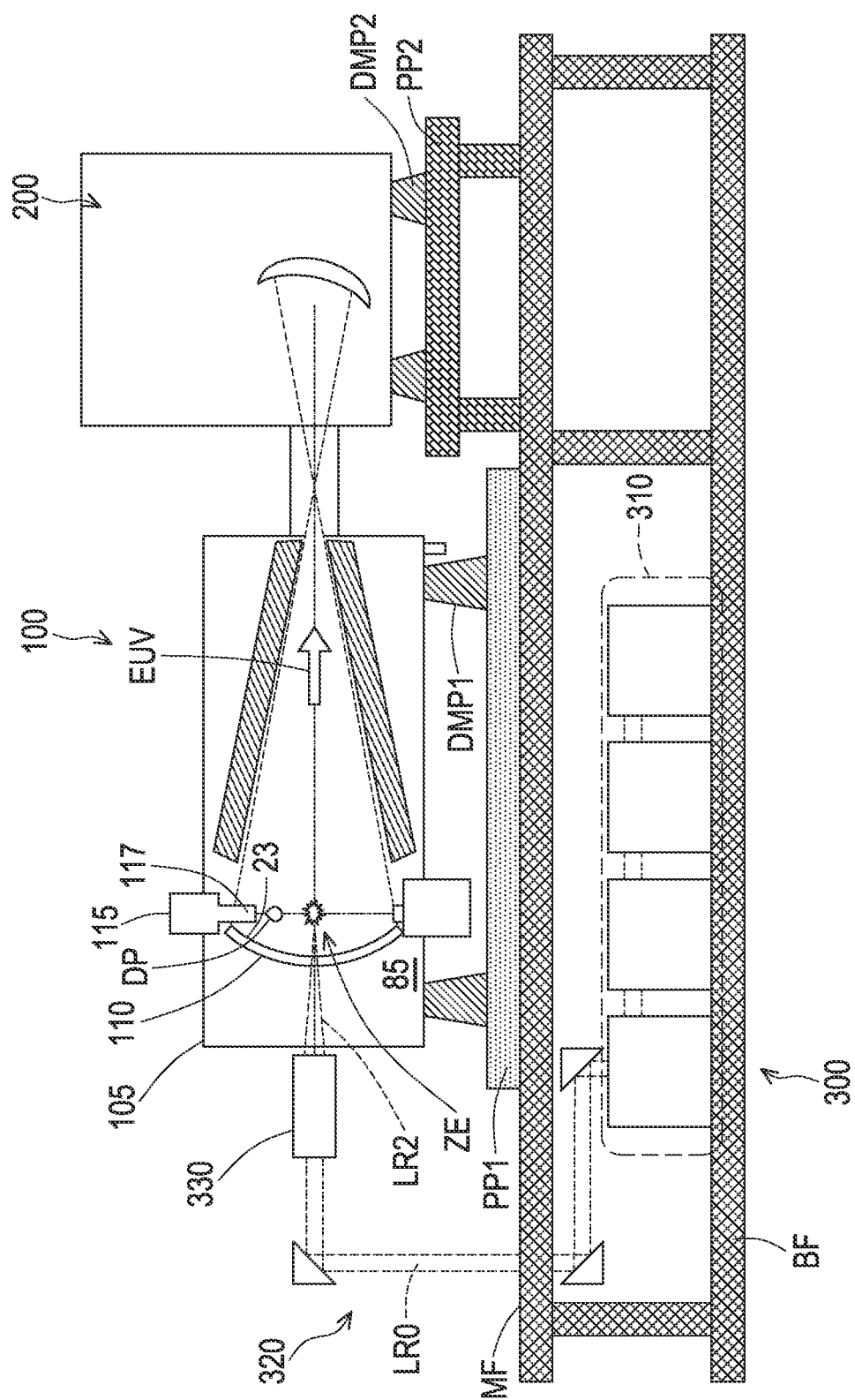
FIG. 1 shows a schematic view of an extreme ultraviolet (EUV) lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

A pellicle is a thin transparent film stretched over a frame that is attached with an adhesive over one side of a reticle to protect the reticle from damage, dust, and/or moisture. Thus, it is desirable that the pellicle is highly transparent to the radiation source of the lithography process. In EUV lithography, the pellicle is desirable to be clean (e.g., free of particles), to be highly transparent in the EUV wavelength region, and to have high durability.

When the reticle is covered by a pellicle, the particles sit on the pellicle instead of the reticle and, thus, when the reticle is imaged on a substrate, the particles that are not in the plane of the reticle do not create a focused image on the substrate. In the present disclosure, the terms of reticle, mask, and photomask are used interchangeably. The pellicle is about 25 nm to about 125 nm thick layer of material that is transparent to the UV radiation source, e.g., transparent to the DUV or EUV radiation source, of the lithography process. In some embodiments, the pellicle is made of SiC, polysilicon, silicon nitride, metallic films or graphene. In some embodiments, when the pellicle is placed, e.g., mounted, on top of the reticle, the pellicle is placed on top of a plurality of studs or fixtures and a distance between about 2 mm to about 5 mm is created between the reticle and the pellicle.

In the present disclosure, in some embodiments, a method of removing a particle from a pellicle includes moving a nozzle over a surface of a membrane of the pellicle to a location of the particle. A droplet of a liquid material is dispensed from the nozzle to cover the particle on the surface of the membrane. A contact of the droplet with the nozzle is monitored and maintained. The droplet carrying the particle is horizontally dragged along the surface of the membrane toward an edge thereof by the nozzle using the surface tension of the droplet. The droplet carrying the particle is sucked off from the edge of the membrane by a vacuum pump, thereby automatically and safely removing the particle without damaging the pellicle.

In the present disclosure, in some embodiments, a system of removing a particle from a pellicle includes a support stage for holding the pellicle; a nozzle to dispense a droplet of a liquid material to cover the particle on a surface of a membrane of the pellicle; a robot arm to move the nozzle; a vacuum pump located on an edge of the membrane to suck off the droplet; a distance detector to detect a distance between the nozzle and the surface; and a processor controller coupled to the robot arm, the vacuum pump, the particle detector, and the distance detector. The processor controller controls the robot arm to horizontally move the nozzle to the location of the particle, to lower the nozzle toward the membrane until the distance reaching a threshold distance, and to horizontally drag the droplet and the particle toward the membrane edge by the nozzle using the surface tension of the droplet; and to activate the vacuum pump to suck off the droplet and the particle from the edge of the membrane, thereby automatically and safely removing the particle without damaging the pellicle.

FIG. 1 shows a schematic view of an EUV lithography system with a laser produced plasma (LPP) EUV radiation source in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit. In some embodiments, a lithography system includes the EUV radiation source 100 and the exposure device 200.

The lithography system is an EUV lithography system designed to expose a resist layer by EUV light (also interchangeably referred herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2. In some embodiments, a mask is transferred into the exposure device 200. As noted, the exposure device 200 is maintained under a vacuum environment and the mask is mounted over a substrate, with a photo resist layer disposed on the substrate. The mask has a pellicle mounted over the reticle. After transferring the mask with the pellicle into the exposure device 200, the air pressure in the enclosure between the reticle and the pellicle is equalized with the vacuum environment of the exposure device 200 through the holes in the mounting fixture (the frame). The EUV radiation generated by the EUV radiation source 100 is directed by the optical components to project the mask on the photo resist layer of the substrate. In some embodiments, after the exposure of the mask on the photo resist layer of the substrate, the reticle with the pellicle is transferred out of the exposure device 200. After transferring the reticle with the pellicle out of the exposure device 200, the air pressure in the enclosure between the reticle and the pellicle is equalized with the atmospheric pressure outside the exposure device 200 through the holes in the mounting fixture.

In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask. The mask is described with respect to FIG. 3A.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm in an embodiment. The laser light beam LR0 generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 is also generated by the excitation laser source 300 and the laser beam LR1 is also focused by the focusing apparatus 330.

In some embodiments, the excitation laser beam LR2 includes a pre-heat laser pulse and a main laser pulse. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200. A droplet DP that does not interact with the laser pulses is captured by the droplet catcher 85.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as: $v_{dp}=d/(t_{rad}-t_o)$ equation (1).

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2:
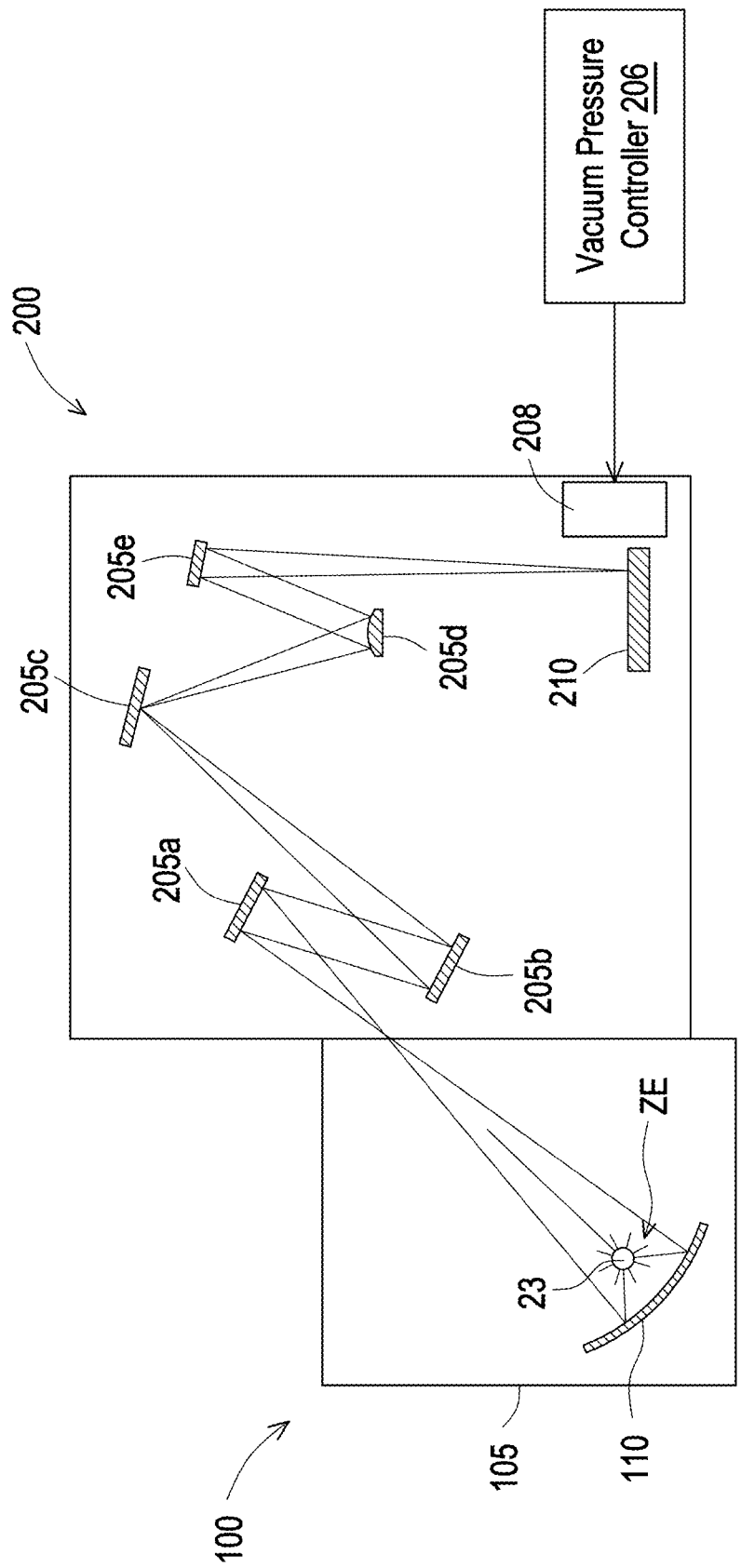
FIG. 2 shows a schematic view of an EUV lithography exposure tool in accordance with some embodiments of the present disclosure.

FIG. 2 shows a schematic view of an EUV lithography (EUVL) exposure tool in accordance with some embodiments of the present disclosure. The EUVL exposure tool of FIG. 2 includes the exposure device 200 that shows the exposure of photoresist coated substrate, a target semiconductor substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic, e.g., a reflective mask 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210. In some embodiments, a pressure inside the exposure device 200 is sensed by a pressure sensor 208 inside the exposure device 200 and is controlled by a vacuum pressure controller 206 that is coupled to the exposure device 200.

As noted above, because gas molecules absorb EUV light, the lithography system for the EUV lithography patterning, e.g., the exposure device 200, is maintained in a vacuum environment to avoid EUV intensity loss. After transferring the reticle with the pellicle into the exposure device 200, the air pressure in the enclosure between the reticle and the pellicle is equalized with the vacuum environment of the exposure device 200 through the holes in the mounting fixture (the frame) and, thus, vacuum is produced in the enclosure between the reticle and the pellicle. In some embodiments, after the exposure of the mask on the photo resist layer of the substrate, the reticle with the pellicle, the reticle structure, is transferred out of the exposure device 200. After transferring the reticle with the pellicle out of the exposure device 200, the vacuum in the enclosure between the reticle and the pellicle is equalized with the atmospheric pressure outside the exposure device 200 through the holes in the mounting fixture and, thus, atmospheric pressure in produced in the enclosure between the reticle and the pellicle.

Figure 3B:
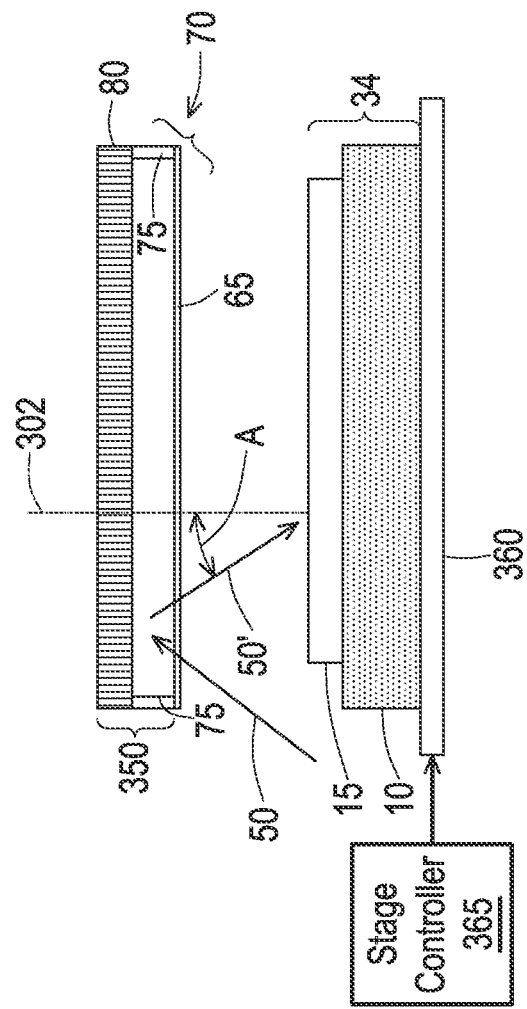
FIGS. 3A and 3B show cross-sectional views of a reflective reticle structure and projecting the reflective reticle structure on a semiconductor device in accordance with some embodiments of the present disclosure.
Figure 3A:
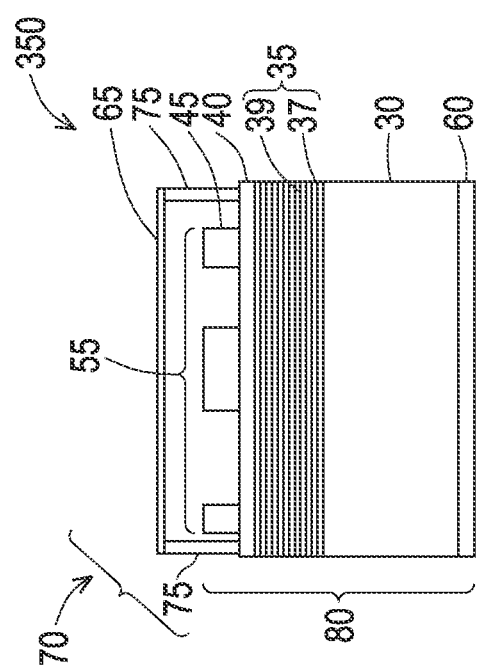

FIGS. 3A and 3B show a cross-sectional view of a reflective reticle structure 350, e.g., a reticle system, and projecting the reflective reticle structure 350 on a semiconductor device in accordance with some embodiments of the present disclosure.

FIG. 3A shows a cross-sectional view of a reflective reticle structure 350 that includes a reticle 80, e.g., a reflective mask. As noted above, the terms mask, photomask, and reticle may be used interchangeably. In some embodiments, the reticle 80 is a reflective mask and is used as part of the reflective reticle structure 350. The reflective reticle structure 350 is consistent with reflective mask 205c of FIG. 2 and is used in the exposure device 200 of FIG. 2.

The reticle 80 includes a substrate 30, reflective multiple layers (ML) 35 that are deposited on the substrate 30, a conductive backside coating 60, a capping layer 40, and an absorption layer 45. In some embodiments, the reflective reticle structure 350 also includes a pellicle structure 70, a mounted structure that includes a membrane 65 mounted on a frame 75.

In some embodiments, the material of the substrate 30 includes $TiO_2$ doped $SiO_2$, or other suitable materials with low thermal expansion. In some embodiments, the substrate 30 includes fused quartz and has a thickness between about 6 mm to about 7 mm.

In some embodiments, the ML 35 includes a plurality of film pairs, such as molybdenum-silicon (Mo/Si) film pairs (e.g., a layer of molybdenum layer 39 above or below a layer of silicon layer 37 in each film pair). In some embodiments, the ML 35 has 40 to 50 pairs of the molybdenum layer 39 and the silicon layer 37 and each molybdenum layer 39 has a thickness of 3 nm and each silicon layer 37 has a thickness of 4 nm. Thus, in some embodiments, the ML 35 has a thickness between 280 nm to 350 nm. Alternatively, the ML 35 may include molybdenum-beryllium (Mo/Be) film pairs, or other suitable materials that are configured to highly reflect the EUV light.

The capping layer 40 may include ruthenium (Ru) and may be disposed on the ML 35 for protection and may have a thickness of 2.5 nm. In some embodiments, the capping layer 40 may include silicon (Si) and may be disposed on the ML 35 for protection and may have a thickness of 4 nm. In some embodiments, the absorption layer 45 that includes a tantalum boron nitride (TaBN) layer is deposited over the ML 35 and the capping layer 40.

In some embodiments, the absorption layer 45 is patterned into pattern features 55 to define a layout pattern for layer of an integrated circuit (IC). In some embodiments, the backside coating 60 includes chromium nitride (CrN) or tantalum boride (TaB) and has a thickness of about 20 nm to about 100 nm. In some embodiments, the absorption layer 45 includes one or a combination of TaBO, TaBN, TaNO, and TaN and has a thickness between 50 nm and 70 nm.

FIG. 3B shows exposing the photoresist of a semiconductor device to radiation in accordance with some embodiments of the present disclosure. FIG. 3B shows the semiconductor device 34 includes a photoresist layer 15 that is disposed on a semiconductor substrate 10. FIG. 3B also shows a radiation beam 50 that is originated from an EUV light source, e.g., EUV light source 100 of FIG. 1. The radiation beam 50 is directed to the reticle 80, e.g., a reflective photomask, where the radiation beam 50' is reflected from the reflective photomask 80 and is incident onto the photoresist layer 15. The incident angle of the radiation beam 50', which is defined with respect to a line 302 that is perpendicular to a top surface of the semiconductor substrate 10 is angle A. As shown in FIG. 3B, the incident radiation beam 50 and the reflected radiation beam 50' pass through the membrane 65 of the pellicle structure 70. In some embodiments, the semiconductor substrate 10, consistent with the semiconductor substrate 210 of FIG. 2, is mounted on a stage 360 that is coupled to and controlled by a stage controller 365 for moving the semiconductor device 34 and exposing different locations of the semiconductor device 34.

Figure 4:
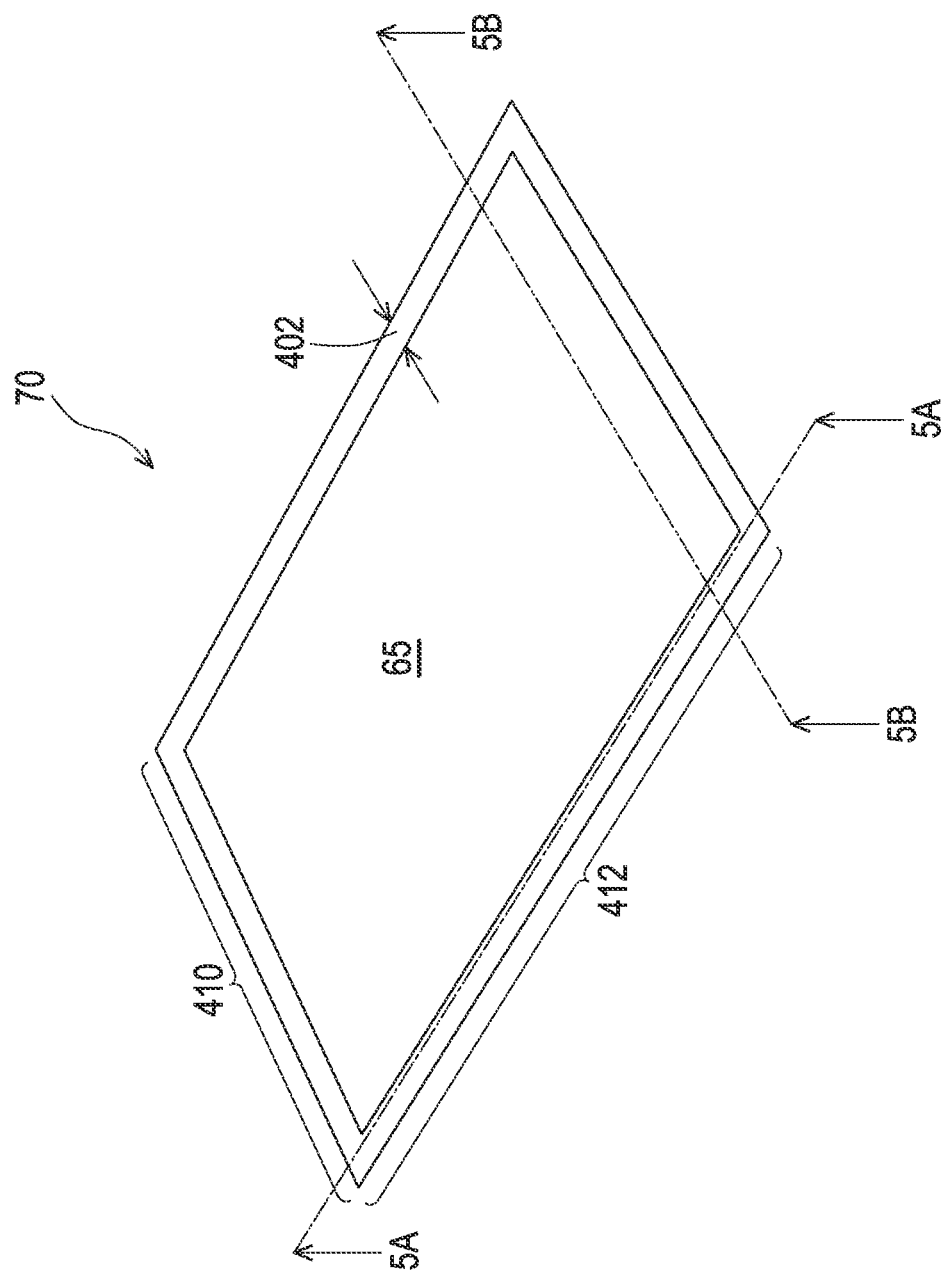
FIG. 4 shows a membrane of a pellicle having a border in accordance with some embodiments of the present disclosure.

FIG. 4 shows the membrane 65, e.g., a transparent membrane, of a pellicle 70 having a border section 402. In some embodiments, the membrane 65 is an about 25 nm to about 125 nm thick layer of a material that is transparent to the UV radiation source, e.g., transparent to the DUV or EUV radiation source of the lithography process. In some embodiments, a width 410 of the membrane 65 is between about 50 mm to about 100 mm and a length 412 of the membrane 65 is between about 100 mm and about 200 mm. In some embodiments, the membrane 65 is attached on a frame 75 from a back side at the border section 402 of the membrane 65.

Figure 5:
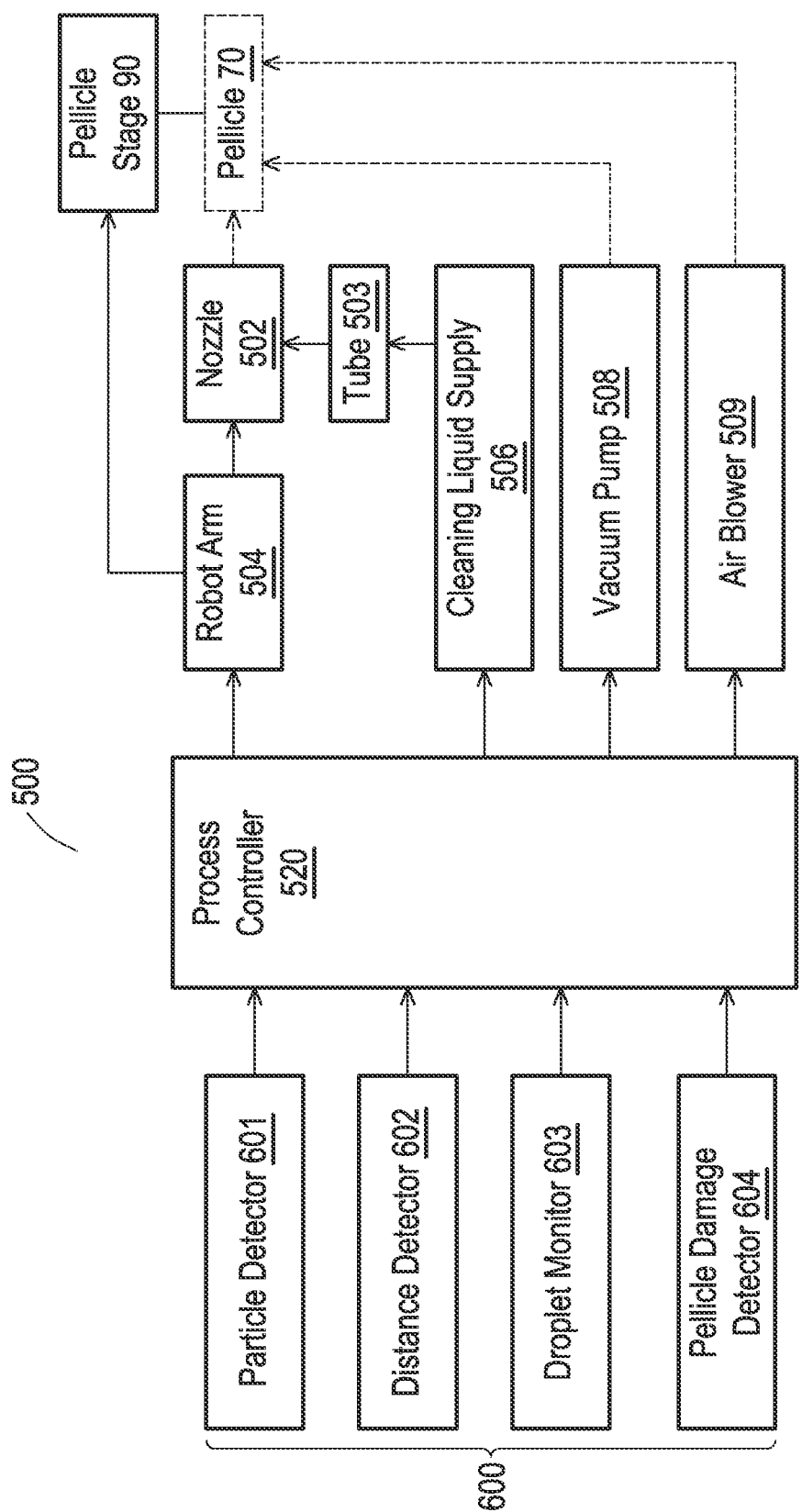
FIG. 5 shows a pellicle cleaning system in accordance with some embodiments of the present disclosure.

FIG. 5 shows a pellicle cleaning system 500 to remove particles from a pellicle in accordance with some embodiments of the present disclosure. In some embodiments, the pellicle cleaning system 500 includes an automated optical inspection (AOI) system 600, a processor controller 520 coupled to the AOI system 600, a nozzle 502, a tube (or pipe) 503 in liquid connection with the nozzle 502, a robot arm 504 to move the nozzle 502, a cleaning liquid supply 506 in liquid connection with the tube 503, a vacuum pump 508, an air blower 509, and a pellicle stage 90 to support the pellicle 70.

In some embodiments, the nozzle 502 dispenses a droplet of a cleaning liquid to cover a particle on a surface of a pellicle 70. In some embodiments, the nozzle 502 drags the droplet along with the particle along the surface of the pellicle 70 using the surface tension of the droplet. In some embodiments, the robot arm 504 horizontally and/or vertically moves the nozzle 502 under the control of the processor controller 520. In some embodiments, the cleaning liquid supply 506 supplies a cleaning liquid to the nozzle 502 via the tube 503 under the control of the processor controller 520. In some embodiments, the vacuum pump 508 is located at an edge of the pellicle 70 and sucks off the droplet along with the particle from the pellicle 70 under the control of the processor controller 520. In some embodiments, the air blower 509 is located at an edge of the pellicle 70 and blows off the droplet and the particle outside of the pellicle 70 under the control of the processor controller 520.

In some embodiments, the processor controller 520 controls the robot arm 504 to horizontally and/or vertically move the nozzle 502, controls the cleaning liquid supply 506 to supply the cleaning liquid to the nozzle 502 via the tube 503, and activates the vacuum pump 508 to suck liquid droplets off the pellicle 70. In other embodiments, the processor controller 520 activates the air blower 509 to blow liquid droplets off the pellicle 70.

In some embodiments, the AOI system 600 includes a particle detector 601, a distance detector 602, a droplet monitor 603, and a pellicle damage detector 604. FIGS. 6A, 6B, 6C and 6D respectively show some AOI devices in accordance with some embodiments of the present disclosure.

Figure 6B:
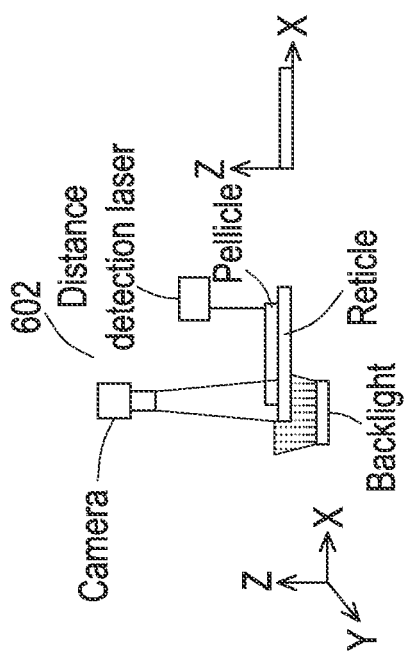
FIGS. 6A, 6B, 6C and 6D show Automated Optical Inspection (AOI) devices in accordance with some embodiments of the present disclosure.
Figure 6D:
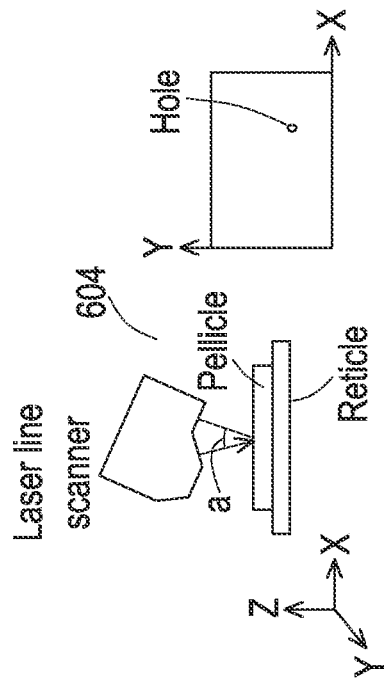
Figure 6A:
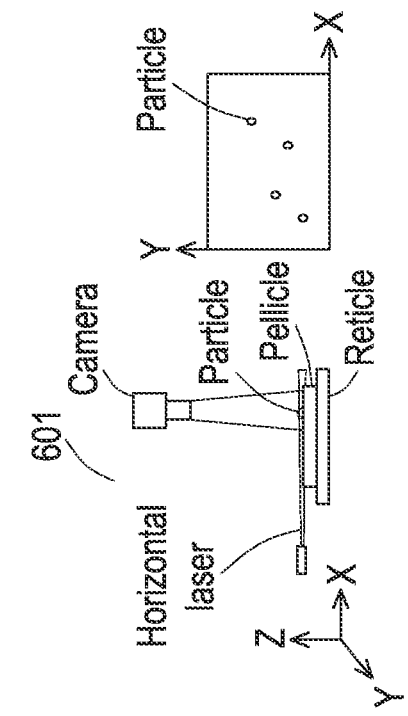

As shown in FIG. 6A, in some embodiments, the particle detector 601 includes a laser source to emit a horizontal laser beam approximately in parallel to a surface of a pellicle of a reticle, and a camera aimed at the surface of the pellicle in a direction perpendicular to the surface of the pellicle to capture images (scattered laser light) of the surface of the pellicle, thereby determining whether there are particles on the surface of the pellicle. The pellicle stage records the X-Y coordinates of the location of the particle, which is stored in a memory device. A particle is located on a surface of the membrane of the pellicle 70 using the particle detector 601. The processor controller 520 (in FIG. 5) uses the location obtained from the particle detector 601 to control the robot arm 504 to move the nozzle 502 toward the location of the particle.

As shown in FIG. 6B, in some embodiments, the distance detector 602 includes a distance detection laser source to emit a laser beam to the surface of the pellicle in a direction perpendicular to the surface of the pellicle, a backlight source to emit a backlight to an edge of the pellicle in direction opposite to the laser beam from the distance detection laser source, and a camera aimed at the edge of the pellicle and the reticle in a direction perpendicular to the surface of the pellicle, thereby determining a thickness of the pellicle and the distance between a head of the nozzle and the surface of the pellicle. The processor controller 520 (in FIG. 5) uses the thickness of the pellicle and the distance to determine whether the distance reaches a threshold distance (f) when the robot arm 504 lowers the nozzle 502 toward the pellicle 70. Once the distance is determined reaching the threshold distance (f), the processor controller 520 controls the robot arm 504 to stop lowering the nozzle 502.

Figure 6C:
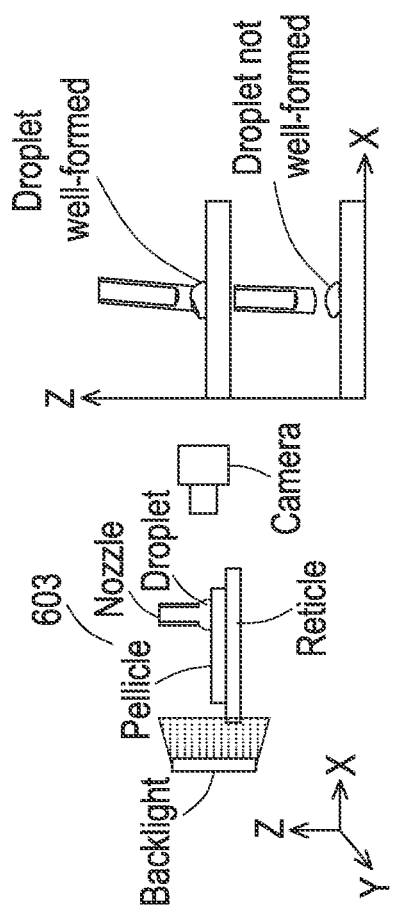

As shown in FIG. 6C, in some embodiments, the droplet monitor 603 includes a backlight source to emit a backlight beam in a direction to the droplet and parallel with the surface of the pellicle; and a camera to receive the backlight beam passing through the droplet to monitor the contact of the droplet with the head of the nozzle, thereby determining whether or not the contact of the droplet with the nozzle is maintained. In some embodiments, the droplet monitor 603 monitors a contact status of the droplet 803 with the nozzle 502, the process controller 520 controls the cleaning liquid supply 506 to adjust a supply of the cleaning liquid to the nozzle 502 based on the monitored contact status, thereby maintaining the contact of the droplet 803 with the nozzle 502.

As shown in FIG. 6D, in some embodiments, the pellicle damage detector 604 includes a laser line scan device that scans the pellicle, emits an incident laser beam to the surface of the pellicle, and receives a reflective laser beam from the surface of the pellicle, in which the incident laser beam and the reflective laser beam form an angle (a) (such as 30, 45 or 90 degree), thereby detecting one or more holes in the transparent pellicle. The pellicle stage records the X-Y coordinates of the location of the hole, which is stored in a memory device. Once one or more holes are detected by the pellicle damage detector 604, the process controller 520 determines that the pellicle 70 is damaged.

FIGS. 7A, 7B, 7C, 7D and 7E show some sequential operations of removing a particle from a pellicle in accordance with some embodiments of the present disclosure. In some embodiments, in a pre-inspection, a pellicle 70 attached to a reticle 80 and supported by a mask stage 90 undertakes an optical inspection by an Integrated Reticle Inspection System (IRIS) to find whether there are any particles on the pellicle 70. In some embodiments, once a particle 801 is found on the pellicle 80, an Out-Of-Control Action Plan (OCAP) will be triggered, the reticle 80 along with the pellicle 70 is transferred to a pellicle cleaning system 500 as shown in FIG. 5, and some operations as shown in FIGS. 7A, 7B, 7C, 7D and 7E are performed to remove the particle 801 from the pellicle 70.

As shown in FIG. 7A, a particle 801 is located on a surface of the membrane of the pellicle 70. In some embodiments, the location of the particle 801 is detected by a particle detector 601 as shown in FIG. 6A. In other embodiments, the location of the particle 801 is received from another device or system (not shown).

As shown in FIG. 7B, a nozzle 502 is moved toward the particle 801 according to the location data obtained from the particle detector 601. In some embodiments, the nozzle 502 is in fluid connection with a cleaning liquid supply 506 via a tube 503 as shown in FIG. 5. In some embodiments, the nozzle 502 is moved to the particle 801 by a robot arm 504 that is controlled by a process controller 520 as shown in FIG. 5. In some embodiments, the nozzle 502 is horizontally moved to the location of the particle 801, and then is lowered toward the particle 801 until a distance between a head of the nozzle 502 and a surface of the pellicle 70 reaching a threshold distance. In some embodiments, the distance between the head of the nozzle 502 and the surface of the pellicle 70 is detected by a distance detector 602 as shown in FIG. 6B.

As shown in FIG. 7C, a droplet 803 of a cleaning liquid material is dispensed from the nozzle 502 to cover the particle 801 on the surface of the pellicle 70. In some embodiments, the cleaning liquid material is an organic solvent, such as an anhydrous alcohol. In some embodiments, a droplet monitor 603 is used to continuously monitor a contact of the droplet 803 with the head of the nozzle 502, thereby determining whether or not the contact of the droplet with the nozzle is maintained. In some embodiments, a supply of the cleaning liquid material to the nozzle 502 is controlled by the process controller 520 to maintain the contact of the droplet 803 with the nozzle 502. In some embodiments, when the droplet monitor 603 finds that the contact of the droplet 803 with the nozzle 502 is lost, the process controller 520 controls the supply of the cleaning liquid material to the nozzle 502 so that the nozzle 502 dispenses additional cleaning liquid material to droplet 803, thereby maintaining the contact of the droplet 803 with the nozzle 502. Once the droplet monitor 603 determines that the contact of the droplet 803 with the nozzle 502 is resumed, the process controller 520 controls the supply of the cleaning liquid material to the nozzle 502 to stop dispensing additional cleaning liquid material to droplet 803. In some embodiments, a volume of the cleaning liquid material is in a range from 0.1 ml to about 10.0 ml. In some embodiments, the volume of the cleaning material is adjusted based on the size of the particles or the number of particles targeted by one supply (droplet) of the cleaning liquid material.

As shown in FIG. 7D, the droplet 803 along with the particle 801 is dragged by the nozzle 502 using the surface tension of the droplet 803 toward an edge of the pellicle 70. In some embodiments, the droplet 803 is dragged by the nozzle 502 at a speed in a range from about 1.0 mm/second to about 10.0 mm/second.

As shown in FIG. 7E, in some embodiments, the droplet 803 along with the particle 801 is suck off from the edge of the pellicle 70 by a vacuum pump 508. In other embodiments, the droplet 803 along with the particle 801 is blown off from the edge of the pellicle 70 by an air blower 509 (not shown in FIG. 7E) to an outside of the pellicle 70.

In addition, in some embodiments, after the removing the particle 801 from the pellicle 70, the pellicle 70 undertakes another optical inspection performed by the IRIS to find whether there are additional particles on the pellicle 70. After that, the pellicle 70 is determined clean if no additional particles are found. In some embodiments, the nozzle dragging the droplet with the particle is moved to another location of another particle to capture the another particle with the same droplet.

Figure 8:
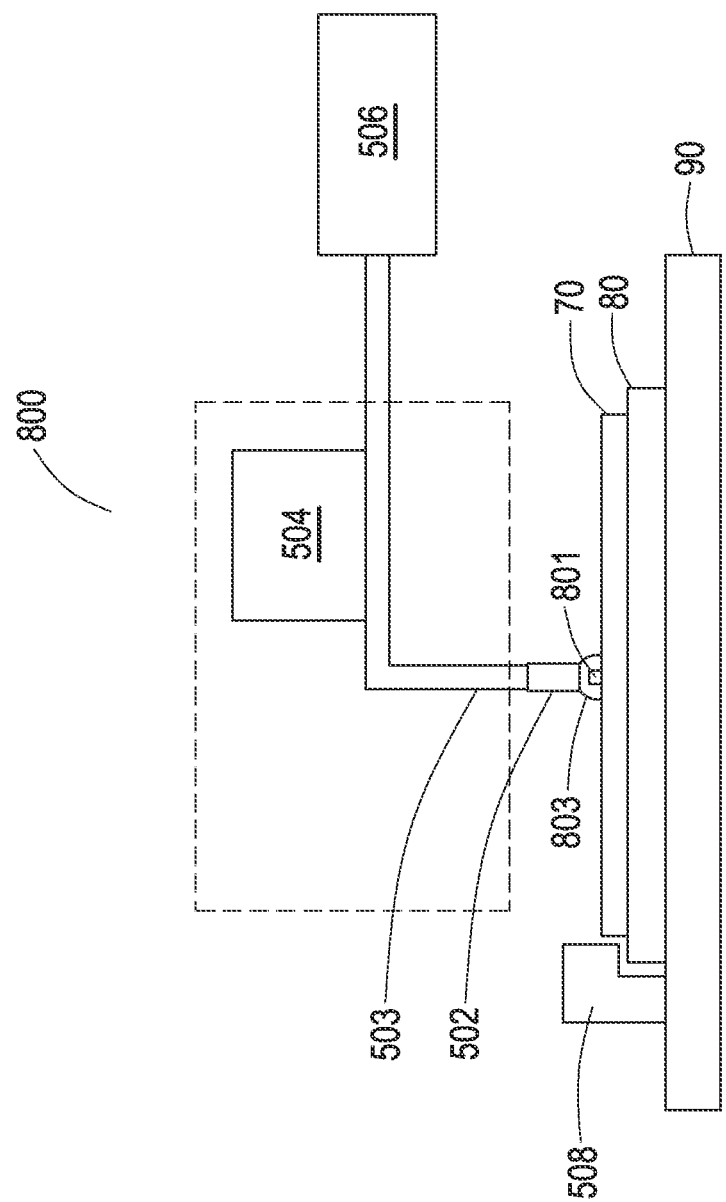
FIG. 8 shows a schematic view of a pellicle cleaning apparatus in accordance with some embodiments of the present disclosure.

FIG. 8 shows a schematic view of a pellicle cleaning apparatus 800 in accordance with some embodiments of the present disclosure. The pellicle cleaning apparatus 800 is used for removing a particle 801 from a pellicle 70. In some embodiments, the pellicle cleaning apparatus 800 includes a support stage 90 for holding a reticle 80 and the pellicle 70, a nozzle 502 to dispense a droplet 803 of a cleaning liquid material to cover the particle 801 on a surface of the pellicle 70, a robot arm 504 to move the nozzle 502 with respect to the surface of the membrane of the pellicle 70, and a vacuum pump 508 located on an edge of the pellicle 70 to suck off the droplet 803 and the particle 801.

In some embodiments, the pellicle cleaning apparatus 800 obtains the location of a particle 801 on the surface of the membrane of the pellicle from a particle detector 601 as shown in FIG. 6A. In some embodiments, the pellicle cleaning apparatus 800 obtains a distance between a head of the nozzle 502 and the surface of the membrane of the pellicle 70 from a distance detector 602 as shown in FIG. 6B.

In some embodiments, the pellicle cleaning apparatus 800 obtains information about the contact of the droplet 803 with a head of the nozzle 502 from a droplet monitor 603 as shown in FIG. 6C. In some embodiments, a cleaning liquid supply 506 to the nozzle 502 is adjusted to maintain the contact of the droplet 803 with the nozzle 502 based on the information about the contact of the droplet 803 with the head of the nozzle 502.

In some embodiments, the pellicle cleaning apparatus 800 is coupled to a process controller 520, which is coupled to the particle detector 601, the distance detector 602, and the droplet monitor 603 (as shown in FIG. 5), and controls the operations of the robot arm 504, the cleaning liquid supply 506, and the vacuum pump 508.

In some embodiments, the processor controller 520 controls the robot arm 504 to horizontally move the nozzle 502 with respect to the surface of the membrane of the pellicle 70 to the location of the particle 801. In some embodiments, the processor controller 520 controls the robot arm 504 to lower the nozzle 502 toward the membrane of the pellicle 70 until the distance between the nozzle 502 and the surface of the membrane of the pellicle 70 reaches a threshold distance (f). In some embodiments, the threshold distance (f) is in a range from about 2.5 mm to about 3.5 mm.

In some embodiments, the process controller 520 controls the robot arm 504 to horizontally drag the droplet 803 along with the particle 801 toward the membrane edge of the pellicle 70 by the nozzle 502 using the surface tension of the droplet 803.

In some embodiments, the process controller 520 activates the vacuum pump 508 to suck off the droplet 803 and the particle 801 from the edge of the membrane of the pellicle 70. In other embodiments, the process controller 520 activates an air blower 509 (in FIG. 5) to blow off the droplet 803 and the particle 801 from the edge of the membrane of the pellicle 70 to an outside of the pellicle 70 (not shown in FIG. 8).

Figure 9B:
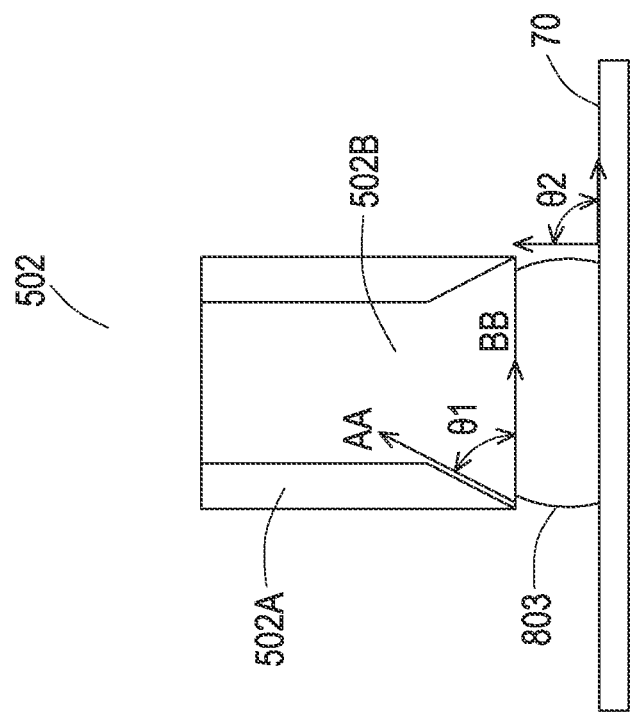
FIGS. 9A and 9B show various nozzle structures of a pellicle cleaning apparatus in accordance with some embodiments of the present disclosure.
Figure 9A:
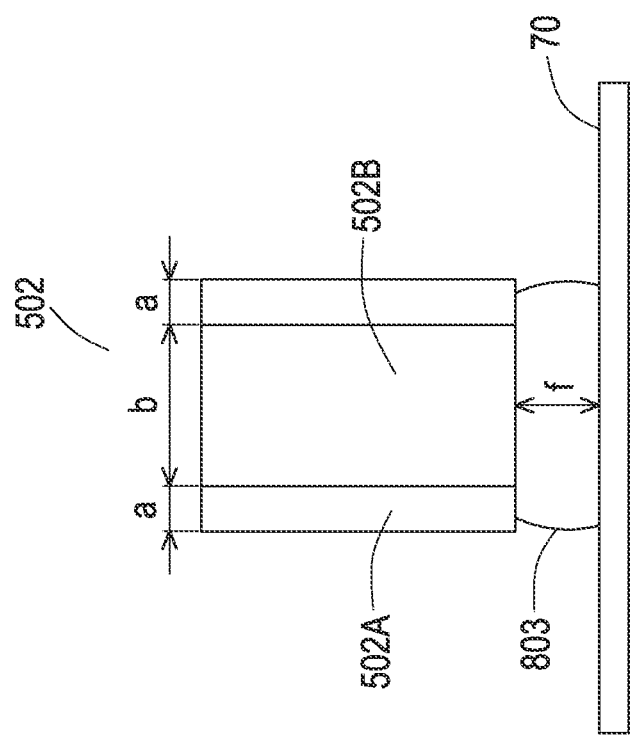

FIGS. 9A and 9B show various nozzle structures of a pellicle cleaning apparatus 800 in accordance with some embodiments of the present disclosure. In some embodiments, the nozzle 502 is made of a thermoplastic material. In some embodiments, the nozzle 502 is made of fluorocarbon polymer, such as poly tetra fluoroethylene (PTFE), poly-fluoro-alkoxy (PFA), fluorinated ethylene propylene (FEP), ethylene-tetra-fluoro-ethylene (ETFE), or poly vinylidene fluoride (PVDF). In some embodiments, the nozzle 502 is made of silica gel. In some embodiments, the nozzle 502 is made of glass or fiberglass. In some embodiments, the nozzle 502 and the tube 503 are made of the same material.

In some embodiments, the nozzle 502 is in a cylindrical shape. The nozzle 502 has a wall 502A and an opening 502B. In some embodiments, a thickness (a) of the wall 502A is in a rage from about 1 mm to about 2 mm, and an inner diameter (b) of the opening 502B is in a range from about 3 mm to about 10 mm. In some embodiments, a ratio of the wall thickness (a) of the wall 502A of the nozzle 502 to the inner diameter (b) of the opening 502B of the nozzle 502 is in a range from about 0.30 to about 0.42.

As shown in FIG. 9B, in some embodiments, the wall 502A of the nozzle 502 is in a V-shape at the head of the nozzle 502, the end line AA of the wall 502A and the end line BB of the opening 502B at the head of the nozzle 502 form a first angle $\theta 1$, which is in a range from about 5 degree to about 70 degree. In some embodiments, the nozzle 502 and the pellicle 70 forms a second angle $\theta 2$, which is about 90 degree. In some embodiments, the second angle $\theta 2$ is in a range from about 70 degree to about 110 degree. In some embodiments, the thickness of the pellicle 70 is greater than 500 μm, and the size of the particle 803 is less than 35 μm.

Figure 10:
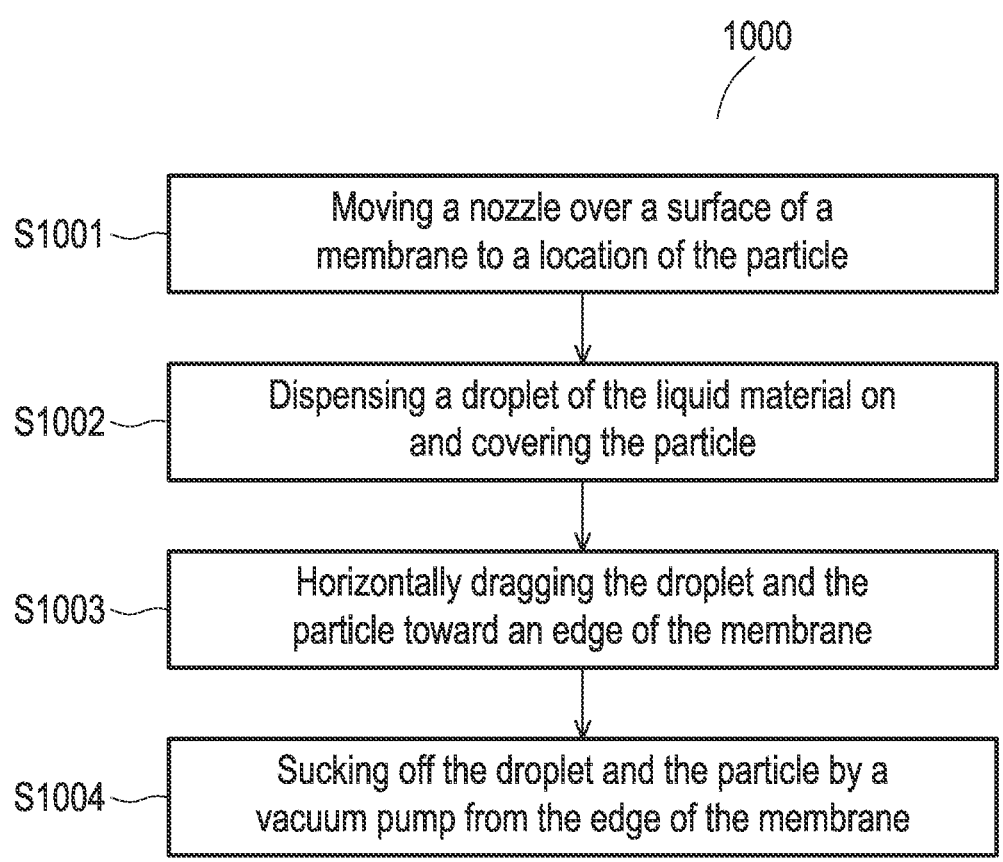
FIG. 10 shows a flowchart of a method of removing a particle from a pellicle in accordance with an embodiment of present disclosure.

FIG. 10 shows a flowchart of a method 1000 of removing a particle from a pellicle in accordance with an embodiment of present disclosure. In some embodiments, a pellicle cleaning system as shown in FIG. 5 is used to clean a pellicle 70. In some embodiments, the pellicle cleaning system 500 includes an AOI system 600, a processor controller 520 coupled to the AOI system 600, a nozzle 502, a tube 503, a robot arm 504 to move the nozzle 502, a cleaning liquid supply 506 in liquid connection with the nozzle 502 via the tube 503, and a vacuum pump 508 or an air blower 509.

It is understood that additional operations can be provided before, during, and after the processes shown by FIG. 10, and some of the operations described below can be replaced or eliminated, for additional embodiments of the method.

The order of the operations/processes may be interchangeable. Materials, configurations, methods, processes and/or dimensions as explained with respect to the foregoing embodiments are applicable to the following embodiments, and the detailed description thereof may be omitted.

At S1001 of FIG. 10, the nozzle 502 is moved over a surface of a membrane of a pellicle 70 to a location of a particle 801 (in FIG. 7B). In some embodiments, the nozzle moves while the retile stage (reticle) stays. In other embodiments, the stage moves while reticle stage stays or both the nozzle and the reticle stage move.

At S1002 of FIG. 10, a droplet 803 of a cleaning liquid material is dispensed from the nozzle 502 on and covering the particle 801 on the surface of the membrane of the pellicle 70 (in FIG. 7C). In some embodiments, the cleaning liquid material is an anhydrous alcohol.

At S1003 of FIG. 10, the droplet 803 along with the particle 801 is horizontally dragged toward an edge of the pellicle 70 by the nozzle 502 using the surface tension of the droplet 803 (in FIG. 7D).

At S1004 of FIG. 10, in some embodiments, the droplet 801 along with the particle 803 is sucked off by a vacuum pump 508 from the edge of the membrane of the pellicle 70 (in FIG. 7E), thereby automatically and safely removing the particle 803 without damaging the pellicle 70. In other embodiments, the droplet 801 along with the particle 803 is blown off by an air blower 509 from the edge of the membrane of the pellicle 70 (not shown).

In some embodiments, before the dispensing the droplet 801, the nozzle 502 is lowered toward the surface of the membrane of pellicle 70 until a distance between the nozzle and the surface of the membrane reaching a threshold distance (f) as shown in FIG. 9A. In some embodiments, the threshold distance (f) is in a range from about 2.5 mm to about 3.5 mm.

In some embodiments, a contact of the droplet 803 with the nozzle 502 is monitored by a droplet monitor 603 (in FIG. 6C). When the contact is found lost or the droplet is found not well-formed, additional cleaning liquid material is dispensed from the nozzle 502 to maintain the contact of the droplet 803 with the nozzle 502 (in FIG. 6C).

Figure 11:
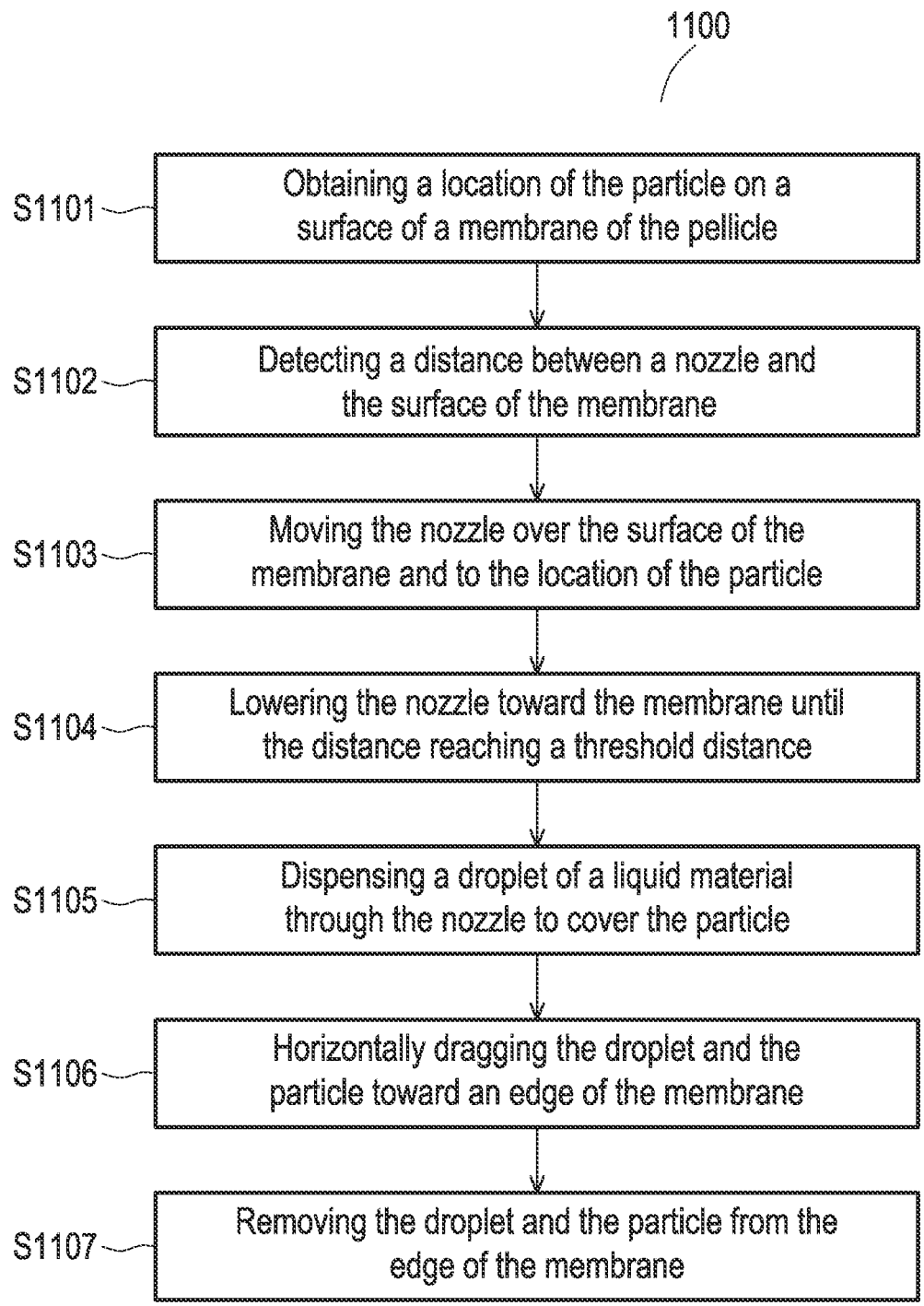
FIG. 11 shows a flowchart of a method of removing a particle from a pellicle in accordance with another embodiment of present disclosure.

FIG. 11 shows a flowchart of a method 1100 of removing a particle 801 from a pellicle 70 in accordance with another embodiment of present disclosure. It is understood that additional operations can be provided before, during, and after the processes shown by FIG. 11, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

At S1101 of FIG. 11, a location of the particle 801 on a surface of a membrane of the pellicle 70 is obtained. In some embodiments, the location of the particle 801 on the surface of the membrane of the pellicle 70 is detected by a particle detector 601 (in FIG. 6A). In other embodiments, the location of the particle 801 on the surface of the membrane of the pellicle 70 is received from another device or system (not shown).

At S1102 of FIG. 11, a distance between the nozzle 502 and the surface of the membrane of the pellicle 70 is detected. In some embodiments, the distance between the nozzle 502 and the surface of the membrane of the pellicle 70 is detected by the distance detector 602 (in FIG. 6B).

At S1103 of FIG. 11, the nozzle 502 is moved over the surface of the pellicle 70 to a place over the location of the particle 70. In some embodiments, the nozzle 502 is moved by a robot arm 504 with respect to the surface of the pellicle 70. In other embodiments, the nozzle 502 is relatively moved with respect to the surface of the pellicle 70 by moving a pellicle stage 90 that holds the pellicle 70.

At S1104 of FIG. 11, the nozzle 502 is lowered by the robot arm 504 toward the pellicle 70 until the distance between the nozzle 502 and the surface of the pellicle 70 reaches a threshold distance (f). In some embodiments, the threshold distance (f) is in a range from about 2.5 mm to about 3.5 mm.

At S1105 of FIG. 11, a droplet 803 of a cleaning liquid material is dispensed through the nozzle 502 to cover the particle 801 on the surface of the pellicle 70.

At S1106 of FIG. 11, the droplet 803 along with the particle 801 is horizontally dragged toward an edge of the membrane of the pellicle 70 by the nozzle 502 using the surface tension of the droplet 803.

At S1107 of FIG. 11, the droplet 803 and the particle 801 are removed from the edge of the membrane of the pellicle 70. In some embodiments, the droplet 803 and the particle 801 are sucked off from the edge of the membrane of the pellicle 70 by a vacuum pump 508, thereby automatically and safely removing the particle 803 without damaging the pellicle. In other embodiments, the droplet 803 and the particle 801 are blown off from the edge of the membrane of the pellicle 70 by an air blower 509 to an outside of the pellicle 70.

In some embodiments, after the droplet 803 and the particle 801 are removed, the surface of the membrane of the pellicle 70 is detected again to find any additional particles. The pellicle 70 is determined clean if no additional particles are found on surface of the pellicle 70.

In some embodiments, a contact of the droplet 803 with the nozzle 502 is monitored, and a supply of the cleaning liquid material to the nozzle 502 is controlled to maintain the contact (in FIG. 6C). When the contact is found lost or the droplet is not well-formed, additional cleaning liquid material is dispensed from the nozzle 502 to maintain the contact of the droplet 803 with the nozzle 502. Otherwise, when the contact is found remained or the droplet is well-formed, no additional cleaning liquid material is dispensed from the nozzle 502.

In some embodiments, the membrane of the pellicle 70 is detected using a pellicle damage detector 604 to find any holes therein (in FIG. 6D). The pellicle 70 is determined damaged once at least one hole is found in the pellicle 70.

Figure 12A:
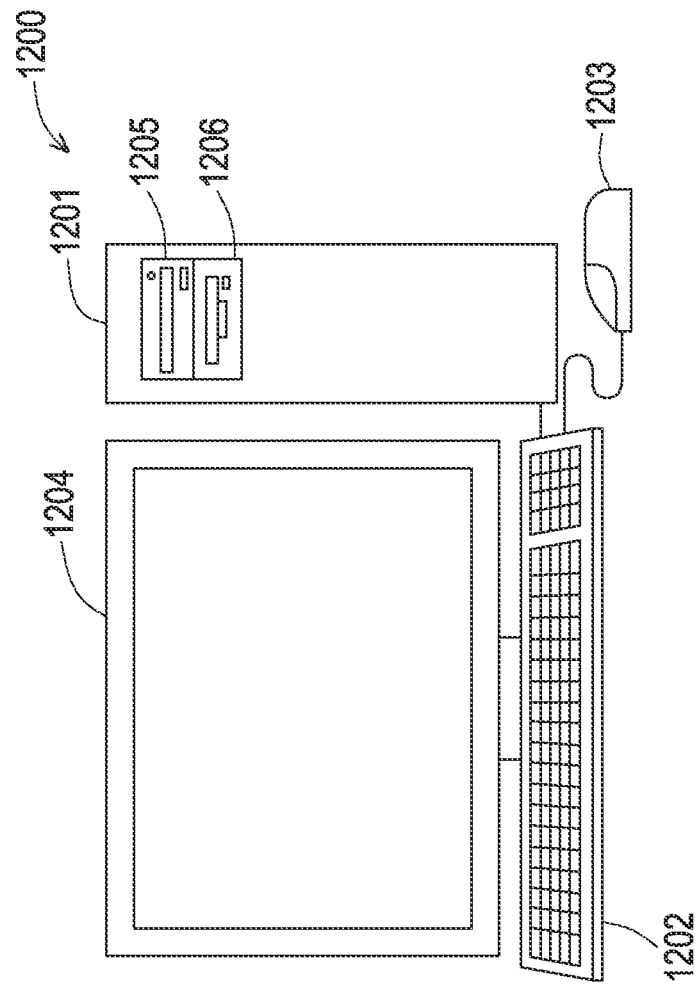
FIGS. 12A and 12B illustrate an apparatus for removing particles from a pellicle of a reticle in accordance with some embodiments of the present disclosure.
Figure 12B:
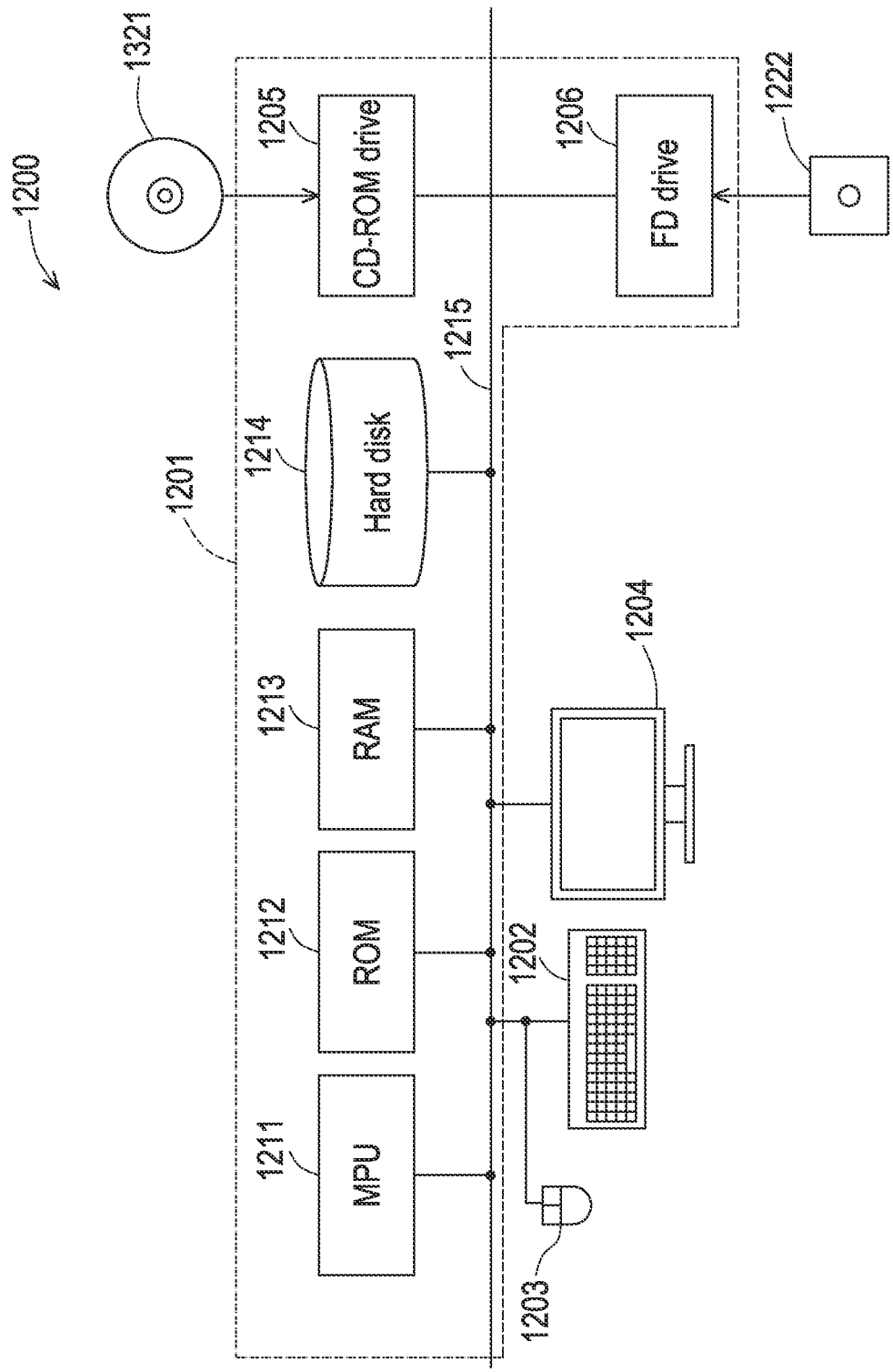

FIGS. 12A and 12B illustrate an apparatus for removing particles from a pellicle of a reticle in accordance with some embodiments of the present disclosure.

FIG. 12A is a schematic view of a computer system that performs the functions of an apparatus for removing particles from the pellicle of the reticle. All of or a part of the processes, method and/or operations of the foregoing embodiments can be realized using computer hardware and computer programs executed thereon. In FIG. 12A, a computer system 1200 is provided with a computer 1201 including an optical disk read only memory (e.g., CD-ROM or DVD-ROM) drive 1205 and a magnetic disk drive 1206, a keyboard 1202, a mouse 1203, and a monitor 1204.

FIG. 12B is a diagram showing an internal configuration of the computer system 1200. In FIG. 12B, the computer 1201 is provided with, in addition to the optical disk drive 1205 and the magnetic disk drive 1206, one or more processors, such as a micro processing unit (MPU) 1211, a ROM 1212 in which a program such as a boot up program is stored, a random access memory (RAM) 1213 that is connected to the MPU 1211 and in which a command of an application program is temporarily stored and a temporary storage area is provided, a hard disk 1214 in which an application program, a system program, and data are stored, and a bus 1215 that connects the MPU 1211, the ROM 1212, and the like. Note that the computer 1201 may include a network card (not shown) for providing a connection to a LAN.

The program for causing the computer system 1200 to execute the functions for removing particles from the pellicle of the reticle in the foregoing embodiments may be stored in an optical disk 1221 or a magnetic disk 1222, which are inserted into the optical disk drive 1205 or the magnetic disk drive 1206, and transmitted to the hard disk 1214. Alternatively, the program may be transmitted via a network (not shown) to the computer 1201 and stored in the hard disk 1214. At the time of execution, the program is loaded into the RAM 1213. The program may be loaded from the optical disk 1021 or the magnetic disk 1222, or directly from a network. The program does not necessarily have to include, for example, an operating system (OS) or a third party program to cause the computer 1201 to execute the functions of the control system for cleaning reticles and projecting layout patterns of the cleaned reticles in the foregoing embodiments. The program may only include a command portion to call an appropriate function (module) in a controlled mode and obtain desired results.

According to some embodiments of the present disclosure, a method of removing a particle from a pellicle includes: moving a nozzle over a surface of a membrane of the pellicle to a location of the particle, wherein the nozzle is in fluid connection with a supply of a liquid material; dispensing a droplet of the liquid material from the nozzle on and covering the particle; horizontally dragging the droplet and the particle toward an edge of the membrane; and sucking off the droplet and the particle by a vacuum pump from the edge of the membrane. In an embodiment, before the dispensing the droplet, the nozzle is lowered toward the surface of the membrane until a distance between the nozzle and the surface of the membrane reaching a threshold distance. In an embodiment, the threshold distance (f) is in a range from about 2.5 mm to about 3.5 mm. In an embodiment, a contact of the droplet with the nozzle is monitored, wherein when the contact is found lost, additional liquid material is dispensed from the nozzle to maintain the contact. In an embodiment, the liquid material includes an anhydrous alcohol. In an embodiment, before moving the nozzle, the location of the particle on the surface of the membrane of the pellicle is obtained. In an embodiment, the nozzle is relatively moved with respect to the surface of the membrane by moving a pellicle stage that holds the pellicle.

According to some embodiments of the present disclosure, a method of removing a particle from a pellicle includes: obtaining a location of the particle on a surface of a membrane of the pellicle; detecting a distance between a nozzle and the surface of the membrane; moving the nozzle over the surface of the membrane and to the location of the particle; lowering the nozzle toward the membrane until the distance reaching a threshold distance; dispensing a droplet of a liquid material through the nozzle to cover the particle; horizontally dragging the droplet and the particle toward an edge of the membrane by the nozzle; and removing the droplet and the particle from the edge of the membrane. In an embodiment, a contact of the droplet with the nozzle is monitored; and a supply of the liquid material to the nozzle is controlled to maintain the contact. In an embodiment, the membrane is detected to find a hole therein, wherein the pellicle is determined damaged once the hole is found. In an embodiment, the removing includes sucking off the droplet and the particle from the edge of the membrane by a vacuum pump. In an embodiment, the removing includes blowing off the droplet and the particle outside of the membrane from the edge of the membrane by an air blower. In an embodiment, the nozzle is made of a thermoplastic material, the nozzle is in a cylindrical shape, and a ratio of a wall thickness (a) of the nozzle to an inner diameter (b) of the nozzle is in a range from about 0.3 to about 0.42. In an embodiment, after the removing the droplet and the particle, the surface of the membrane is detected to find an additional particle, wherein the pellicle is determined clean if no additional particle is found.

According to some embodiments of the present disclosure, a system of removing a particle from a pellicle includes: a support stage for holding the pellicle; a nozzle to dispense a droplet of a liquid material to cover the particle on a surface of a membrane of the pellicle; a robot arm to move the nozzle; a vacuum pump located on an edge of the membrane to suck off the droplet; a distance detector to detect a distance between the nozzle and the surface; and a processor controller coupled to the robot arm, the vacuum pump, and the distance detector, wherein the processor controller is configured to control the robot arm to horizontally move the nozzle to the location of the particle, to lower the nozzle toward the membrane until the distance reaching a threshold distance, and to horizontally drag the droplet and the particle toward the membrane edge using the nozzle; and to activate the vacuum pump to suck off the droplet and the particle from the edge of the membrane. In an embodiment, a pellicle damage detector is configured to detect the membrane to find a hole therein, wherein once the hole in the membrane is found, the pellicle is determined damaged. In an embodiment, the threshold distance is in a range from about 2.5 mm to about 3.5 mm. In an embodiment, a droplet monitor is configured to monitor a contact of the droplet with the nozzle, wherein the processor controller is configured to control a supply of the liquid material to the nozzle to maintain the contact of the droplet with the nozzle. In an embodiment, the droplet monitor includes a backlight source to emit a backlight in a direction to the droplet and parallel with the surface of the membrane; and a backlight camera to receive the backlight passing through the droplet to monitor the contact of the droplet with the nozzle. In an embodiment, the nozzle is made of a thermoplastic material, and the nozzle is a cylindrical nozzle having a wall thickness (a) greater than 1 mm and an inner diameter (b) in a range from about 3 mm to about 10 mm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of removing a particle from a pellicle, comprising:
    moving a nozzle over a surface of a membrane of the pellicle to a location of the particle, wherein the nozzle is in fluid connection with a supply of a liquid material;
    dispensing a droplet of the liquid material from the nozzle on and covering the particle;
    with the nozzle in contact with the droplet on the membrane, dragging the droplet and the particle by the nozzle toward an edge of the membrane using a surface tension of the droplet; and
    sucking off the droplet and the particle by a vacuum pump from the edge of the membrane.

2. The method of claim 1, further comprising before the dispensing the droplet, lowering the nozzle toward the surface of the membrane until a distance between the nozzle and the surface of the membrane reaches a threshold distance.

3. The method of claim 2, wherein the threshold distance is in a range from about 2.5 mm to about 3.5 mm.

4. The method of claim 1, further comprising monitoring the contact of the droplet with the nozzle, wherein when the contact is found to be lost, additional liquid material is dispensed from the nozzle to maintain the contact.

5. The method of claim 1, wherein the liquid material comprises an anhydrous alcohol.

6. The method of claim 1, further comprising before moving the nozzle, obtaining the location of the particle on the surface of the membrane of the pellicle.

7. The method of claim 1, wherein the nozzle is relatively moved with respect to the surface of the membrane by moving a pellicle stage that holds the pellicle.

8. A method of removing a particle from a pellicle, comprising:
    obtaining a location of the particle on a surface of a membrane of the pellicle;
    detecting a distance between a nozzle and the surface of the membrane;
    moving the nozzle over the surface of the membrane and to the location of the particle;
    lowering the nozzle toward the membrane until the distance reaches a threshold distance;
    dispensing a droplet of a liquid material through the nozzle to cover the particle;
    with the nozzle in contact with the droplet on the membrane, horizontally dragging the droplet and the particle toward an edge of the membrane by the nozzle; and
    removing the droplet and the particle from the edge of the membrane.

9. The method of claim 8, further comprising:
    monitoring the contact of the droplet with the nozzle; and
    controlling a supply of the liquid material to the nozzle to maintain the contact.

10. The method of claim 8, further comprising detecting the membrane to find a hole therein, wherein the pellicle is determined damaged once the hole is found.

11. The method of claim 8, wherein the removing comprises sucking off the droplet and the particle from the edge of the membrane by a vacuum pump.

12. The method of claim 8, wherein the removing comprises blowing off the droplet and the particle outside of the membrane from the edge of the membrane by an air blower.

13. The method of claim 8, wherein the nozzle is made of a thermoplastic material, wherein the nozzle is in a cylindrical shape, and wherein a ratio of a wall thickness of the nozzle to an inner diameter of the nozzle is in a range from about 0.30 to about 0.42.

14. The method of claim 8, further comprising after the removing the droplet and the particle, detecting the surface of the membrane to find an additional particle, wherein the pellicle is determined clean if no additional particle is found.

15. A method of removing a particle from a pellicle, the method comprising:
    moving at least one of a nozzle and the pellicle such that the nozzle is disposed proximal to the particle on the pellicle;
    dispensing a liquid from the nozzle to form a droplet on the particle;
    moving at least one of the nozzle and the pellicle such that the nozzle draws the droplet and the particle to an edge of the pellicle through contact between the nozzle and the droplet and use of a surface tension of the droplet; and
    removing the droplet and the particle from the edge of the pellicle.

16. The method of claim 15, wherein the removing the droplet and the particle from the edge of the pellicle comprises sucking the droplet and the particle from the edge of the pellicle.

17. The method of claim 15, wherein the removing the droplet and the particle from the edge of the pellicle comprises blowing the droplet and the particle off the edge of the pellicle.

18. The method of claim 15, further comprising capturing an additional particle with the droplet before moving the droplet to the edge of the pellicle.

19. The method of claim 15, further comprising adjusting a distance between the nozzle and the pellicle to a threshold distance before dispensing the liquid.

20. The method of claim 18, wherein the capturing the additional particle includes moving at least one of the nozzle and the pellicle such that the nozzle draws the droplet to a location of the additional particle.

* * * * *